United States Patent [19]

Kalfus et al.

[11] 4,117,350

[45] Sep. 26, 1978

[54] SWITCHING CIRCUIT

[75] Inventors: Martin Aaron Kalfus, Morganville; Hans Werner Becke, Morristown, both of N.J.

[73] Assignee: RCA Corporation, New York, N.Y.

[21] Appl. No.: 783,219

[22] Filed: Mar. 31, 1977

[51] Int. Cl.² .................................................. H03K 17/72
[52] U.S. Cl. ............................ 307/252 C; 307/252 M; 323/22 SC
[58] Field of Search ........... 307/252 C, 252 J, 252 M; 323/22 SC

[56] References Cited

U.S. PATENT DOCUMENTS

| 3,439,189 | 4/1969 | Petry | 307/252 J |
| 3,564,294 | 2/1971 | Balchin | 307/252 M |
| 3,694,670 | 9/1972 | Marzolf | 307/252 M |

*Primary Examiner*—John Zazworsky
*Attorney, Agent, or Firm*—H. Christoffersen; Allen LeRoy Limberg; John M. O'Meara

[57] ABSTRACT

Transistor and thyristor devices having paralleled main current paths are responsive to a control signal, for turning-on the transistor for conducting up to a predetermined limited magnitude of current, and the thyristor for conducting current of a magnitude greater than this limited magnitude. If the current reduces to below the predetermined limited magnitude, the thyristor turns off, and the transistor continues conducting current through its main current path down to a relatively low value of voltage thereacross.

10 Claims, 3 Drawing Figures

CURRENT RANGE IN WHICH SCR IS PREDOMINANT CURRENT CARRIER ($I > I_{CE\,MAX.}$)

CURRENT RANGE IN WHICH TRANSISTOR IS SOLE CURRENT CARRIER ($I < I_{CE\,MAX.}$)

SWITCHING CIRCUIT

The present invention relates to switching circuits, and more specifically, relates to a switching circuit capable of initially conducting relatively high magnitudes of current in one state of operation, relatively low magnitudes of current with a relatively low voltage drop across the switching circuit in another state of operation, and no current in an off state. A switching circuit embodying the present invention comprises a transistor and a thyristor (such as a silicon controlled rectifier or SCR) having their main conduction paths in parallel connection. When these devices are turned on, making their main conduction paths conductive, the thyristor can conduct initial relatively high-magnitude current surges and the transistor can continue conduction of relatively low-magnitude current while reducing the voltage drop across the parallel connection to a relatively low value as compared to the thyristor. A representative application in which such a switching circuit exists is a turn-off circuit for a gate-turn-off silicon controlled rectifier.

Figure 1:
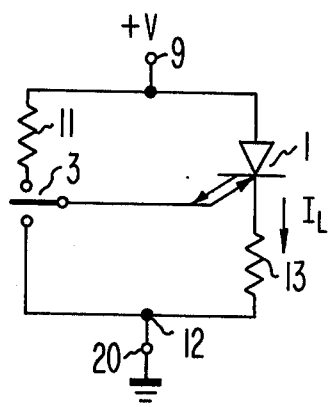
FIG. 1 is a circuit schematic diagram of a prior art circuit for operating a gate-turn-off silicon controlled rectifier.

In FIG. 1, the gate-turn-off silicon controlled rectifier 1 (hereinafter referred to as a GTO) is turned on by operating switch 3 to complete a conduction path between power terminal 9 and the gate electrode of GTO 1. Terminal 9 is receptive of an operating voltage $+V$, and completion of the conduction path through resistor 11 and switch 3 delivers current to the gate electrode, to turn on GTO 1. When GTO 1 is so turned-on, the relative resistance of its main conduction path between its anode and cathode electrode is substantially decreased, permitting current $I_L$ to flow from terminal 9 through the main conduction path between the anode-cathode electrodes of GTO 1 to the load 13. Once a GTO is turned on via the application of a turn-on signal at its gate electrode, the turn-on signal can be removed without interrupting conduction through the main conduction path. This is a characteristic of the GTO and other devices such as SCR's included in the family of devices known as thyristors. Accordingly, in the normal operation of this circuit, after the GTO 1 has been turned on, switch 3 can be returned to its neutral state in which the gate of GTO is left unconnected.

The GTO 1 is turned-off by operating switch 3 to close the conduction path between the gate electrode of GTO 1 and a source of reference potential connected to terminal 20, ground, in this example. In this circuit state, a substantially high percentage of the current flowing through the anode electrode of GTO 1 is diverted from the cathode electrode to the gate electrode and ground. The gate current flowing to ground rapidly diminishes in value as the GTO 1 turns off, reducing to substantially zero magnitude at turn-off of GTO 1. Where, as in this example, the GTO 1 has a cathode load 13, at the lower values of the gate turn off current, the diminishing voltage across the load 13 causes the load 13 to act as a battery, assisting in supplying turn-off current and reverse biasing the cathode-gate junction of the GTO 1.

With presently available GTO's, just as turn-off of the GTO is attained, the gate electrode must be clamped to a level of voltage that is within about 0.25 volt of the voltage at the cathode electrode (ground, in the case of GTO 1), to ensure complete turn-off, or the GTO may turn on again. Also, the initial turn-off current flowing from the gate electrode of the GTO may be as high as 80% of the load current $I_L$ for a period of from 10 to 20 microseconds. As indicated, this reverse gate current (Igq) rapidly decays, and at turn-off of the GTO 1 only a substantially small magnitude of leakage current flows from the anode to the gate electrode to ground.

Figure 2:
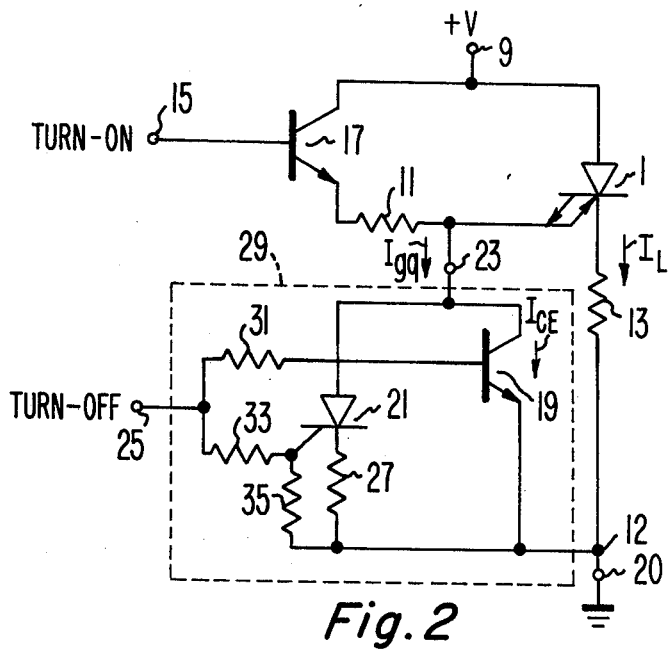
FIG. 2 is a circuit schematic diagram of one embodiment of the present invention, applied for use in a circuit for operating a gate-turn-off silicon controlled rectifier.

In FIG. 2, an electronic switching circuit is substituted for switch 3 and used to turn on and turn off the GTO 1. A positive pulse is applied to turn-on terminal 15 for turning-on transistor 17. When transistor 17 is so turned-on, the operating voltage $+V$ is applied to the end of the resistor 11 remote from the end connected to the gate electrode of GTO 1. Accordingly, current flows through resistor 11 into the gate electrode of GTO 1, turning on GTO 1 to conduct current $I_L$ to load 13.

In FIG. 2, SCR 21 might be omitted and the transistor 19 alone be used to turn-off GTO 1. To this end a positive-going turn-off signal would be applied to terminal 25, for turning on transistor 19, causing the impedance between its collector and emitter electrodes to be substantially reduced, thereby effectively connecting the gate electrode of GTO 1 to ground. If the magnitude of the load current $I_L$ is substantially high, say about 30 amperes, anywhere from about 12 to 24 amperes of negative gate current, for example, may flow from the gate electrode of GTO 1 into current input terminal 23 and through transistor 19 to ground. Although this relatively high negative gate currently rapidly decays, as previously described, the transistor 19 must be capable of conducting such a high level of surge current without damage, and at a very low collector-emitter saturation voltage. Such a transistor would be relatively expensive, although it would be capable of turning off the GTO 1 and clamping the gate to about 0.2 volt, for insuring that the GTO 1 does not turn back on. The use of a single transistor for so turning-off a GTO is known in the prior art, but is uneconomical for use in many applications where high magnitude load currents must be conducted.

As has also been attempted in the prior art, transistor 19 might be omitted and an SCR 21 alone used to turn-off the GTO 1. In such case, a positive level turn-off signal would be applied to terminal 25 for application to the gate electrode of the SCR 21, for turning on the SCR 21. When so turned on, the impedance between the anode and the cathode electrodes of the SCR 21 is substantially reduced, permitting turn-off current to flow from the gate electrode of GTO 1 through the main current path between the anode and cathode electrodes of SCR 21 in series with a current limiting resistor 27 to ground. Although relatively inexpensive SCR's, such as SCR 21, are capable of conducting relatively high magnitudes of current, the voltage drop across the anode-cathode electrodes of present-day silicon thyristors (includes SCR's) is in its operational range limited to a minimum value of about 0.7 volt, known as the holding voltage. When the voltage across the anode-cathode electrodes of an SCR decreases to below this holding voltage value, the SCR cannot sustain conduction and turns off, substantially increasing the impedance between its anode and cathode electrodes. For this reason, attempts in the prior art to employ just an SCR for use in turning off a GTO, as described, has met only limited success. Many GTO's can never turn off or turn back on because of the inability of the SCR to sufficiently reduce the voltage at the gate electrode of the GTO to about 0.25 volt.

The present inventors have found that a relatively inexpensive transistor can be combined with a thyristor to provide a composite switching circuit 29, as shown in FIG. 2. The composite switching circuit 29 can be either fabricated from discrete components or in integrated circuit form. As shown, the main current path residing between the collector-emitter electrodes of a transistor 19 is connected in parallel with the main current path residing between anode-cathode electrodes of an SCR 21, with the current limiting resistor 27 being placed in series with the main current path of the SCR 21. The value of a bias resistor 31 is chosen in consideration of a predetermined value of a positive voltage applied to input terminal 25, for turning-on transistor 19 and limiting the maximum value of current conducted through its main current path to a value $I_{CEMAX}$ in accordance with its current gain, $\beta_{19}$. The values of resistors 33 and 35, are chosen to insure that in consideration of the predetermined value of input signal or trigger signal applied to input terminal 25, a sufficient amplitude of turn-on voltage is applied to the gate electrode of the SCR 21 to turn it on. Alternatively, of course, turn-off might be controlled by two simultaneously switched constant current sources, the one supplying base current to transistor 19 in place of resistor 31 and the other supplying gating current to SCR 21 in place of potential-dividing resistors 33 and 35. These current sources might be provided, for example, from the respective collector electrodes of PNP bipolar transistors arranged to be simultaneously switched into and out of conduction.

Figure 3:
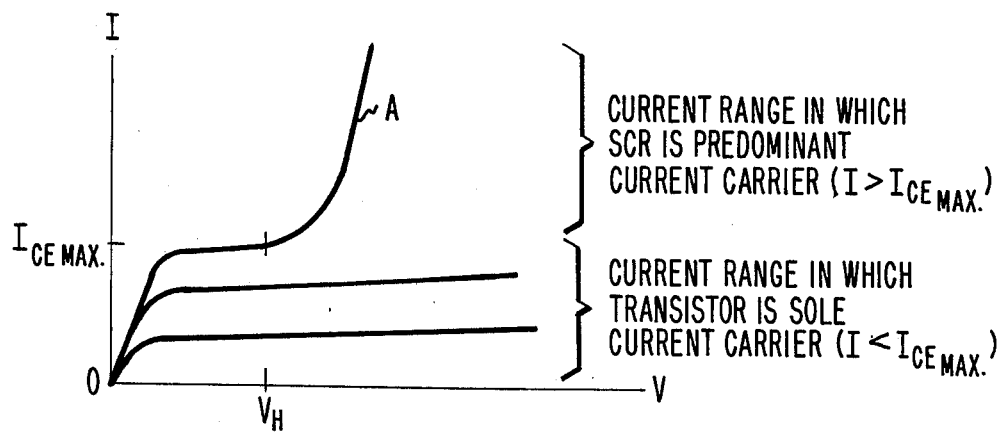
FIG. 3 is illustrative of the current-voltage characteristic operating curve for the embodiment of the invention of FIG. 2.

In FIG. 3, the operating curve for the composite switching circuit 29 shows that when a current source is connected to terminal 23, and the predetermined input signal is applied to input terminal 25 for turning on SCR 21 and transistor 19, that for values of current greater than $I_{CEMAX}$, the SCR 21 is the predominant current carrier. Of course, in this range of operation of the composite switching circuit 29, the transistor 19 is conducting its maximum value of current $I_{CEMAX}$. As the magnitude of current from the current source connected to terminal 23 decreases in magnitude to $I_{CEMAX}$, the transistor 19 demands an increasing amount of that current. As this current is reduced to less than $I_{CEMAX}$, the anode to cathode potential of SCR 21 falls below the value of holding voltage $V_H$ (see FIG. 3) required for maintaining SCR 21 in conduction, and SCR 21 turns off. It should be noted that the characteristic operating curve for an SCR, such as SCR 21, substantially includes the portion of the solid line portion representing the SCR as the predominant current carrier. The family of curves just at and below the current value $I_{CEMAX}$ represent the characteristic operating curve for the transistor 19. Accordingly, the characteristic operating curve for the composite switching circuit 29 is the curve labelled A.

In FIG. 2, the composite switching circuit 29 is shown applied for use as a turn-off circuit for turning-off the GTO 1. In operation, as previously described, the GTO 1 is turned on by applying a turn-on signal to terminal 15, for turning on transistor 17 for applying a positive voltage to the gate electrode of the GTO 1. Once turned on, the GTO 1 will remain in conduction after the turn-on signal is removed from terminal 15, causing transistor 17 to turn off. To turn-off GTO 1, a turn-off signal is applied to terminal 25 of the composite switching circuit 29, causing the SCR 21 and transistor 19 to turn on. Substantially instantaneously, SCR 21 will conduct a substantially high magnitude of current from the gate of GTO 1 to terminal 20, the terminal 20 being connected to a source of reference potential (ground in this example). Concurrently, the transistor 19 is conducting its predetermined maximum magnitude of current $I_{CEMAX}$ from the gate electrode of the GTO 1 to ground. As previously described, the initial surge of the relatively high-magnitude current drawn from the gate electrode of the GTO 1 will rapidly diminish in magnitude as the GTO 1 begins turning-off. When such turn-off current from the gate electrode of GTO 1 decreases to a value below $I_{CEMAX}$, the voltage across the main current path of transistor 19 will decrease to below the holding voltage $V_H$ of the SCR 21, turning-off the SCR. As the negative gate current or turn-off current being drawn from the gate electrode of the GTO 1 continues to decrease in value, the transistor 19 conducting this current through its main current path, continues to proportionately decrease the voltage across its current path to a relatively low value of about 0.2 volt. When the GTO 1 completes its turn-off, the gate current Igq of GTO 1 flowing through transistor 19 will decrease to substantially zero magnitude, and the transistor 19 will serve to clamp the gate electrode of GTO 1 to about 0.2 volt, ensuring that the GTO 1 cannot turn back on. The turn-off signal applied to terminal 25 may now be removed, since the turn-off of the GTO 1 is now complete. It should be noted that the composite switching circuit 29 is also operative to turn off GTO 1 if the cathode electrode of GTO 1 is directly connected to terminal 20, and load 13 is relocated, for example, to between terminal 9 of the anode electrode of GTO 1.

The composite switching circuit 29 can be used in applications other than turning off a GTO 1. For example, the composite switching circuit 29 may be useful in discharging capacitors or inductors, and in other applications where it is required that an initially high magnitude of current be conducted during one state of operation of the switching circuit, and in another state of operation of the switching circuit a relatively low magnitude of current be conducted with a substantially low value of voltage existing across the switching circuit at such times.

What is claimed is:

1. A circuit for turning-off a gate-turn-off controlled rectifier having a gate electrode, and having a main current path connected between a first terminal for receiving an operating voltage and a second terminal for receiving a reference voltage, comprising:
    a third terminal for receiving a turn-off signal;
    thyristor means having a main current path connected between said gate electrode and said second terminal and having a control electrode connected to said third terminal for conducting a major portion of the initial peak gate current that attends the turn-off of the gate-turn-off controlled rectifier through its main current path in response to said turn-off signal; and transistor means having a main current path connected between said gate electrode and said second terminal, and having a control electrode connected to said third terminal for conducting a predetermined limited portion of said gate current through its main current path in response to said turn-off signal, to reduce the voltage drop between said gate electrode and said second terminal when said gate current is insufficient to supply this predetermined limited magnitude and thereby completing the turn-off of said gate-turn-off rectifier.

2. The circuit of claim 1, wherein said thyristor means corresponds to a silicon controlled rectifier having an anode connected to the gate of said gate-turn-off rectifier, having a cathode connected to said second terminal, and a gate electrode as its control electrode.

3. The circuit of claim 1, wherein said transistor means corresponds to a bipolar transistor having a collector electrode connected to said gate electrode, having an emitter electrode connected to said second terminal, and a base electrode serving as its control electrode.

4. The circuit of claim 2, further including a current limiting resistor connected between the cathode electrode of said silicon controlled rectifier and said second terminal.

5. The circuit of claim 3, further including resistor means connected between said third terminal and said base electrode, the value of said resistor means being chosen to bias said transistor for conducting the predetermined limited portion of said gate current through its main current path.

6. In a circuit comprising a gate-turn-off silicon controlled rectifier having an anode, a cathode, and a gate electrode:
a first terminal for receiving an operating voltage, to which said anode is connected, a second terminal for receiving a reference potential, to which said cathode is connected; a third terminal for receiving turn-off signals; and means for selectively applying a turn-on signal to the gate electrode in turning on said gate-turn-off rectifier, and improved means for turning off said gate-turn-off rectifier, comprising:
silicon controlled rectifier means having a control electrode and being responsive to actuating signals applied at said control electrode for selectively completing a first current path between said gate electrode and said second terminal, to conduct a major portion of the initial peak gate current that attends the turn-off of the gate-turn-off controlled rectifier;
transistor means having a control electrode and being responsive to current flow through said control electrode for selectively completing a second current path between said gate electrode and said second terminal;
means responsive to each of said turn-off signals for applying an actuating signal to the control electrode of said silicon controlled rectifier means; and
means responsive to each of said turn-off signals for supplying current to the control electrode of said transistor means in conditioning said transistor means to conduct a predetermined limited portion of said gate current and to complete the turn-off of said gate-turn-off rectifier by reducing the voltage drop between said gate electrode and said second terminal when said gate current is insufficient to supply this predetermined limited magnitude.

7. A multi-state switching circuit, comprising:
a first terminal for receiving current;
a second terminal for receiving a reference voltage;
a thrid terminal for receiving turn-on signals;
thyrsitor means for providing a first conduction path between said first and second terminals in response to each of said turn-on signals, said thyristor means having a control electrode connected to said third terminal and conducting a relatively high magnitude of current through said first conduction path until the voltage thereacross is reduced below a predetermined holding level, to raise the relative impedance of said first conduction path, and thereby discontinuing the flow of current therethrough; and
transistor means for providing a second conduction path between said first and said second terminals in response to each of said turn-on signals, said transistor means having a control electrode connected to said third terminal and conducting a predetermined maximum magnitude of current through said second conduction path while said first conduction path is conductive, said predetermined maximum current through said second conduction path being reducible when said first conduction path is nonconductive to decrease the voltage between said first and second terminals below said predetermined holding level of said thyristor means.

8. The multi-state switching circuit of claim 7, wherein said thyristor means corresponds to a silicon controlled rectifier having an anode and a cathode electrode between which said first conduction path resides, said anode and cathode electrodes being connected individually to said first and second terminals, respectively, and a gate electrode as said control electrode.

9. The multi-state switching circuit of claim 7, wherein said thyristor means corresponds to a gate-turn-off silicon controlled rectifier having an anode electrode connected to said first terminal, a cathode electrode connected to said second terminal, and a gate electrode connected to said third terminal, said first conduction path residing between said anode and cathode electrodes, said gate electrode serving as said control electrode.

10. The multi-state switching circuit of claim 7, wherein said transistor means corresponds to a bipolar transistor having a collector electrode connected to said first terminal, an emitter electrode connected to said second terminal, and a base electrode as said control electrode.

* * * * *